United States Patent
Chung (10) Patent No.: US 7,253,685 B2
(45) Date of Patent: Aug. 7, 2007

(54) CLASS AB AMPLIFIER HAVING ADJUSTABLE QUIESCENT CURRENT AND OUTPUT CURRENT

(75) Inventor: Kyu-Young Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 11/178,931

(22) Filed: Jul. 11, 2005

(65) Prior Publication Data

US 2006/0012431 A1 Jan. 19, 2006

(30) Foreign Application Priority Data

Jul. 13, 2004 (KR) ............... 10-2004-0054493

(51) Int. Cl.
*H03F 3/45* (2006.01)
(52) U.S. Cl. ............................ 330/255; 330/267
(58) Field of Classification Search .......... 330/253, 330/255, 257, 261, 264, 267
See application file for complete search history.

(56) References Cited

U.S. PATENT DOCUMENTS

| | | | |
|---|---|---|---|
| 4,284,957 A | 8/1981 | Haque | 330/253 |
| 4,335,355 A | 6/1982 | Haque | 330/253 |
| 4,737,732 A | 4/1988 | Westwick | |
| 5,311,145 A * | 5/1994 | Huijsing et al. | 330/255 |
| 5,325,069 A | 6/1994 | Sundby | 330/253 |
| 6,384,683 B1 * | 5/2002 | Lin | 330/257 |
| 6,714,076 B1 * | 3/2004 | Kalb | 330/255 |

FOREIGN PATENT DOCUMENTS

| | | |
|---|---|---|
| JP | 2001-160722 | 6/2001 |
| KR | 1020010030408 A | 4/2001 |

* cited by examiner

*Primary Examiner*—Henry Choe
(74) *Attorney, Agent, or Firm*—F. Chau & Assoc., LLC (57) ABSTRACT

A class AB amplifier capable of easily controlling the amount of quiescent current and the amount of amplifier output current. The amplifier includes an input circuit that transform a voltage difference between input signals into a current; a current mirror including the (the Pull Up and Pull Down transistors of the) output circuit of the amplifier controls the quiescent current through the Pull Up and Pull Down transistors output circuit; and a control circuit in the current mirror (to which a first control voltage and a second control voltage are applied), adjusts the amount of quiescent current flowing through the output circuit in a first operating mode (by controlling a first bias current that is proportionate to the quiescent current in the current mirror), and controls the amount of the output current sourced or sinked (in response to the change in the voltages at the first and second output nodes of the input circuit) in a second operating mode. The first and second control voltages are DC voltages supplied from the outside of the class AB amplifier, and the amount of first bias current is determined by the first control voltage. The amounts of quiescent current and output current can be easily controlled.

24 Claims, 4 Drawing Sheets

CLASS AB AMPLIFIER HAVING ADJUSTABLE QUIESCENT CURRENT AND OUTPUT CURRENT

BACKGROUND OF THE INVENTION

This application claims priority under 35 USC § 119 to Korean Patent Application No. 10-2004-0054493, filed on Jul. 13, 2004, in the Korean Intellectual Property Office, the disclosure of which is incorporated herein in its entirety by reference.

1. Field of the Invention

The invention relates to an amplifier, and more particularly, to a class AB amplifier capable of easily controlling the amount of a quiescent current during a static state of the class AB amplifier and controlling an output current in an operating (amplifying) state.

2. Desscription of the Related Art

Push-pull amplifiers made up of CMOS transistors are extensively used in consumer goods, (e.g., mainly in acoustic amplifiers). Amplifiers are most generally categorized into analog amplifiers and digital amplifiers.

Class A amplifiers, class B amplifiers, and class AB amplifiers are analog amplifiers, while class D amplifiers are digital amplifiers. The performance of an acoustic amplifier is commonly measured by its linearity rather than by its (power) efficiency. Therefore, analog linear amplifiers are popular in the field of acoustic amplifiers, even though they are typically the most power efficient. In other words, a typical analog amplifier having excellent linearity has had poor (energy) efficiency.

Until now, when a class A amplifier, a class B amplifier, or a class AB amplifier with excellent linearity has been used a large-output acoustic amplifier, a large power loss has been unavoidable.

In particular, in the case of the class A amplifier, the rate of power loss is typically greater than a maximum rate of amplifier output power. In general, the efficiency rate of the class A amplifier is less than 25%. In class A amplifier, there is always some quiescent power (current) used for bias or reference circuitry that is not delivered to the load.

As an alternative to the class A analog amplifier, a class B push-pull amplifier in which two transistors are combined in the form of an emitter follower to minimize energy loss, has been introduced. However, although the class B push-pull amplifier has higher efficiency, crossover distortion occurs when a signal level is low.

Two transistors installed in the class B amplifier are alternately switched ON or OFF. When a small amount of current flows through the transistors, they are switched on/off at a high speed. However, when a lot of current flows through the transistors, it is difficult to switch them on/off at a high speed. Since no bias current flows through the class B amplifier, the transistors are not switched on/off at a high speed in a region where significant currents flows, which aggravates the total harmonic distortion (THD).

In the case of the class AB amplifier, which is an intermediate type between the class A and B amplifiers, a certain amount of (quiescent) current flows through it even in a static state. The size of the current flowing through the class AB amplifier is far smaller than that of current flowing through the class A amplifier but is much larger than that of current flowing through the class B amplifier. Accordingly, the greater the amount of bias (quiescent) current flowing through the class AB amplifier, the more closely the characteristics of the particular class AB amplifier is to those of the class A amplifier. By contrast, the less the amount of bias (quiescent) current flowing through the class AB amplifier, the more closely the characteristics of a particular class AB amplifier is to those of the class B amplifier.

Accordingly, there is a growing need to control the operation of the class AB amplifier so that a desired amount of current can flow through it in both a static state and an operating state.

SUMMARY OF THE INVENTION

The invention provides a class AB amplifier in which the amount of quiescent current and the amount of output current can be easily controlled.

According to one aspect of the invention, there is provided a class AB amplifier comprising an input circuit controlling voltages at a first output node and a second output node by transforming a difference in voltages between input signals into a current; an output circuit outputting an output current to the outside of the Class AB amplifier in response to a change in the voltages at the first and second output nodes; and a control circuit to which a first control voltage and a second control voltage are applied, which controls the amount of quiescent current flowing through the output circuit when a first bias current is supplied in a first operating mode, and controls the amount of the output current in response to the change in the voltages at the first and second output nodes in a second operating mode.

The input circuit is a Folded Cascode operational transconductance amplifier (OTA). The control circuit controls the amount of the quiescent current to be proportional to the amount of the first bias current according to current mirror method. (Two of control circuit transistors, and the pull-up transistor PUTR and the pull-down transistor PDTR of the output circuit, form a current mirror.)

The first operating mode is a mode where voltages of the input signals are equal to each other and the quiescent current flows through the output circuit. The second operating mode is a mode where the voltages of the input signals are different from each other and the output current is output (sourced) from or supplied to (sinked into) the output circuit.

The first and second control voltages are DC voltages supplied from the outside of the Class AB amplifier, and the amount of the first bias current is determined by the first control voltage.

The output circuit comprises a pull-up transistor having a first end to which a power supply voltage is applied, a gate connected to the first output node, and a second end connected to a third output node; and a pull-down transistor having a first end connected to the third output node, a gate connected to the second output node, and a second end to which a ground voltage is applied.

The control circuit comprises a first control transistor having a first end to which the power supply voltage is applied, a gate to which the first control voltage is applied, and a second end connected to a first node; a second control transistor having a first end connected to the first node, a gate connected to the second output node, and a second end to which the ground voltage is applied; a third control transistor having a first end and a second end connected to the first and second output nodes, respectively, and a gate connected to the first node; and a fourth control transistor having a first end and a second end connected to the first and second output nodes, respectively, and a gate to which the second control voltage is applied.

The first bias current flows from the first control transistor to the second control transistor. The third control transistor is an NMOS transistor and the fourth control transistor is a PMOS transistor.

The control circuit comprises a first control transistor having a first end to which the power supply voltage is applied, a gate connected to the first output node, and a second end connected to the first node; a second control transistor having a first end connected to the first node, a gate to which the first control voltage is applied, and a second end to which the ground voltage is applied; a third control transistor having a first end and a second end connected to the first and second output nodes, respectively, and a gate to which the second control voltage is applied; and a fourth control transistor having a first end, a second end, and a gate connected to the first and second output nodes and the first node, respectively.

The first bias current flows from the first control transistor to the second control transistor. The third control transistor is an NMOS transistor and the fourth control transistor is a PMOS transistor.

According to another aspect of the invention, there is provided a class AB amplifier comprising a Folded Cascode operational transconductance amplifier (OTA) controlling voltages at a first output node and a second output node by transforming a voltage difference between input signals into a current; an output circuit outputting an output current to the outside of the Class AB amplifier in response to a change in the voltages at the first and second output nodes; and a control circuit controlling the amount of the output current by adjusting the amount of quiescent current flowing through the output circuit using a first bias current generated in response to a first control voltage in a first operating mode, and adjusting the amount of current flowing along a first current path and a second current path, which formed between the first and second output nodes, using the first control voltage and a second control voltage in a second operating mode.

According to another aspect of the invention, there is provided an analog amplifier comprising: an operational transconductance amplifier (OTA) controlling voltages at a first output node and a second output node by transforming a voltage difference between input signals into a first current; and a current mirror including an output circuit of the analog amplifier. The current mirror may further include a control circuit having a fixed or adjustable first bias current. The quiescent current flowing through the output circuit is maintained (by the current mirror) proportionate to the first bias current, in a first operating mode where voltages of the input signals are equal to each other and the quiescent current flows through the output circuit.

During an amplification mode, the output circuit outputs an output current, to a load connected to of the analog amplifier, in response to a difference between the voltages at the first and second output nodes, during which the output current, is proportional to the difference between the voltages at the first and second output nodes. The output current is likewise proportional to the difference between input signals.

BRIEF DESCRIPTION OF THE DRAWINGS

The above and other aspects and features of the invention will become more apparent by describing in detail exemplary embodiments thereof with reference to the attached drawings in which.

DETAILED DESCRIPTION OF THE INVENTION

Hereinafter, exemplary embodiments of the invention will be described in detail with reference the accompanying drawings. The same reference numerals represent the same elements throughout the drawings.

Figure 1:
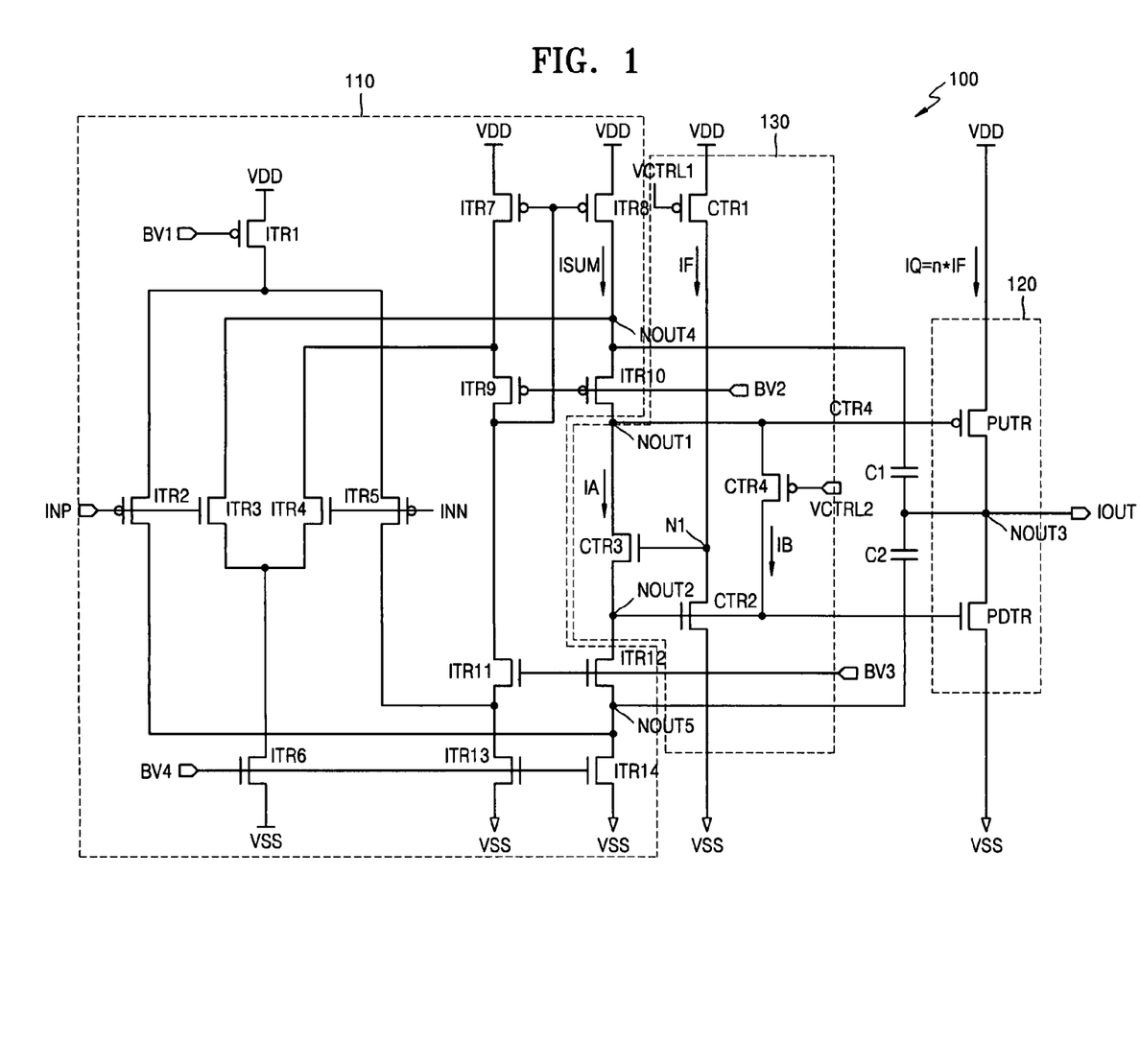
FIG. 1 is a circuit diagram illustrating the operation of a class AB amplifier in a static state according to an embodiment of the invention.

FIG. 1 is a circuit diagram illustrating the operation of a class AB amplifier 100 in a static state according to an embodiment of the invention. The class AB amplifier 100 of FIG. 1 includes an input circuit 110, an output circuit 120, and a control circuit 130.

The input circuit 110 transforms a voltage difference between input signals INP and INN into a current so as to control voltages at a first output node NOUT1 and a second output node NOUT2. The output circuit 120 outputs an output current IOUT of the class AB amplifier 100 in response to a change in the voltages at the first and second output nodes NOUT1 and NOUT2.

A first control voltage VCTRL1 and a second control voltage VCTRL2 are applied to the control circuit 130. When, in a first operating mode, a first bias current IF is supplied to the control circuit 130, the control circuit 130 controls the amount of quiescent current IQ flowing through the (Pull Up transistor PUTR of) output circuit 120. Also, in a second operating mode, the control circuit 130 controls the amount of the output current IOUT in response to a change in the voltages at the first and second output nodes NOUT1 and NOUT2.

In the first operating mode, the voltages of the input signals INP and INN are equal to each other and the quiescent current IQ flows through the output circuit. In the second operating mode, the voltages of the input signals INP and INN are different from each other and the output current IOUT is output (sourced) from or input (sinked) to the output circuit 120.

In this embodiment, the class AB amplifier 100 uses a Folded-Cascode operational transconductance amplifier (OTA) as the input circuit 110. The Folded-Cascode OTA is a circuit that transforms a difference between two voltages (at INP and INN) into a current.

The input circuit 110 operates in response to four bias voltages BV1 through BV4. That is, when the four bias voltages BV1 through BV4 are applied to the input circuit 110, transistors ITR1, ITR9, ITR10, ITR11, ITR12, ITR6, ITR13, and ITR14 are turned ON to operate the input circuit 110.

If the voltage of the input signal INP is higher than that of the input signal INN, transistor ITR3 transmits a larger current toward a ground voltage VSS than transistor ITR4, and as a result, a voltage at a fourth output node NOUT4 becomes lower than the voltage at the source of transistor ITR9. A change in the voltage at the fourth output node NOUT4 changes the voltages of the first output node NOUT1 and of a second output node NOUT2.

In contrast, when the voltage of the input signal INP is lower than that of the input signal INN, transistor ITR3 transmits a smaller current toward the ground voltage VSS than transistor ITR4. As a result, the voltage at the fourth output node NOUT4 becomes higher than the source voltage of the transistor ITR9. A change in the voltage at the fourth output node NOUT4 changes the voltages at the first and second output nodes NOUT1 and NOUT2.

The output circuit 120 includes a pull-up transistor PUTR and a pull-down transistor PDTR. A power supply voltage VDD is applied to a first end of the pull-up transistor PUTR, and its gate and second end are connected to the first output node NOUT1 and a third output node NOUT3, respectively.

The gate of the pull-down transistor PDTR is connected to the second output node NOUT2. A first end of the pull-down transistor PDTR is connected to the third output node NOUT3 and the ground voltage VSS is applied to a second end thereof.

The degree to which each of the pull-up transistor PUTR and the pull-down transistor PDTR are turned ON is controlled by the voltages at the first output node NOUT1 and the second output node NOUT2, respectively, thereby controlling the amounts of output current IOUT or quiescent current IQ.

The quiescent current IQ flows from the power supply voltage VDD of the output circuit 120 to the ground voltage VSS when the Class AB amplifier 100 enters a static state since the voltages of the input signals INP and INN are equal to each other.

When the Class AB amplifier 100 operates, the output current IOUT is output (sourced) from the power supply voltage VDD of the output circuit 120 to the outside of the output circuit 120 via the third output node NOUT3, or flows from (is sinked through) the third output node NOUT3 to the ground voltage VSS, since the voltages of the input signals INP and INN are different from each other. The amount of quiescent current IQ and amount of output current IOUT are thus controlled by the control circuit 130.

The control circuit 130 includes first through fourth control transistors CTR1 through CTR4. The control circuit 130 controls the amount of quiescent current IQ to be proportional to the amount of the first bias current IF according to a current mirror method. The first and second control transistors CTR1 and CTR2, and the pull-up transistor PUTR and the pull-down transistor PDTR of the output circuit 120 form a current mirror.

The power supply voltage VDD is applied to a first end of the first control transistor CTR1, the first control voltage VCTRL1 is applied to its gate, and its second end is connected to a first node N1. A first end of the second control transistor CTR2 is commonly connected to the first node N1, its gate is connected to the second output node NOUT2, and the ground voltage VSS is applied to its second end.

A first end and a second end of the third control transistor CTR3 are connected to the first and second output nodes NOUT1 and NOUT2, respectively, and its gate is connected to the first node N1. A first end and a second end of the fourth control transistor CTR4 are connected to the first and second output nodes NOUT1 and NOUT2, respectively, and the second control voltage VCTRL2 is applied to its gate.

The first and second control voltages VCTRL1 and VCTRL2 are DC voltages supplied from the outside of the Class AB amplifier 100. The amount of first bias current IF is determined by the first control voltage VCTRL1. The first bias current IF flows from (through) the first control transistor CTR1 and to (and through) the second control transistor CTR2. The third control transistor CTR3 is an NFET (e.g., NMOS) transistor and the fourth control transistor CTR4 is a PFET (e.g., PMOS) transistor.

The operation of the Class AB amplifier 100 in a static state will now be described. In the static state, the voltages of the input signals INP and INN are equivalent to each other, and thus, the quiescent current IQ flows through the output circuit 120. The control circuit 130 controls the amount of quiescent current IQ.

When the first control voltage VCTRL1 is applied to the first control transistor CTR1, the first control transistor CTR1 is turned ON and the first bias current IF flows through the first control transistor CTR1. The first and second control transistors CTR1 and CTR2, and the pull-up transistor PUTR and the pull-down transistor PDTR of the output circuit 120 form a current mirror.

Accordingly, when the size of the pull-down transistor PDTR is "n" times larger than that of the second control transistor CTR2, the amount of quiescent current IQ flowing through the output circuit 120 is "n" times more than that of first bias current IF.

When the bias voltage BV4 is applied to the transistors ITR13 and ITR14, the transistors ITR13 and ITR14 are turned ON and a current ISUM flows through the input circuit 110 via a transistor ITR8. At the first output node NOUT1, the current ISUM is divided into a first current IA and a second current IB. The first and second currents IA and IB flow along different current paths (to output Node NOUT2).

The amount of second current IB flowing in the static state is computed according to the following equation:

Equation 1

$$IB = K(V_{GS} - V_{TH})^2 = K((VDD - V_{GS_{PUTR}} - VCTRL2) - V_{TH})^2 \quad (1),$$

wherein K denotes a coefficient (of transistor CTR4), $V_{GS}$ denotes a voltage between the gate and source of the fourth control transistor CTR4, and $V_{TH}$ denotes a threshold voltage of the fourth control transistor CTR4. As indicated in Equation (1), the gate-to-source voltage $V_{GS}$ between the gate and source of the fourth control transistor CTR4 can be obtained by subtracting the voltage $V_{GS_{PUTR}}$ (between the gate and source of the pull-up transistor PUTR) from the power supply voltage VDD and then subtracting the second control voltage VCTRL2 from the result of the first subtraction.

Accordingly, when the class AB amplifier 100 is in the static state, the quiescent current IQ is proportional (by multiple "n") to the first bias current IF according to the current mirror method. The first bias current IF is controlled by the first control voltage VCTRL1, and thus, the quiescent current IQ is also controlled by the first control voltage VCTRL1. Accordingly, it is possible to easily control the amount of quiescent current IQ (using the current mirror) by adjusting the first control voltage VCTRL1.

Figure 2:
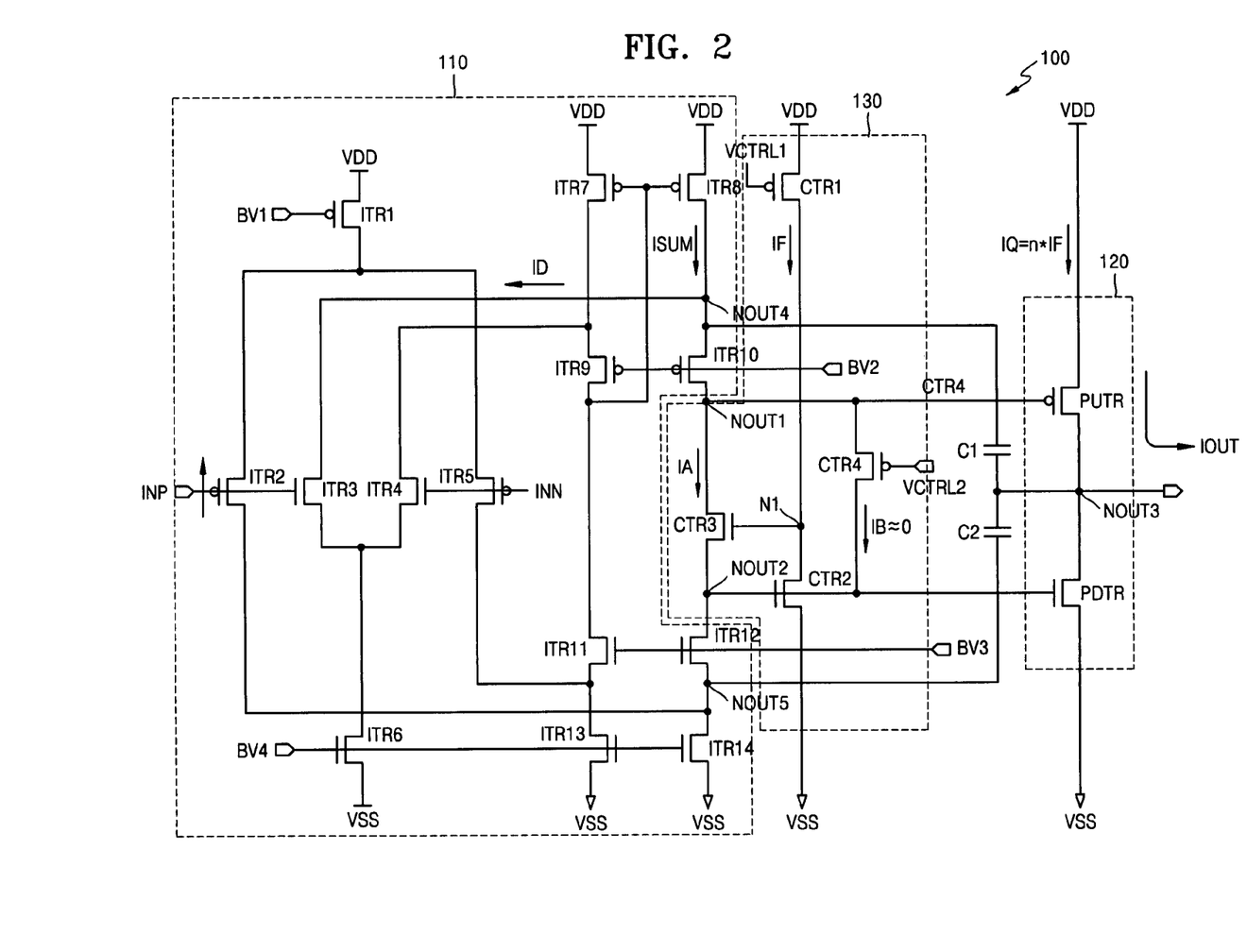
FIG. 2 is a circuit diagram illustrating the operation of the class AB amplifier of FIG. 1 in an amplifying state.

FIG. 2 is a circuit diagram illustrating the operation of the class AB amplifier of FIG. 1 while operating (in an amplifying (operational) state) according to an embodiment of the invention. Referring to FIG. 2, when the voltage of the input signal INP is greater than that of the input signal INN, the amount of current supplied from (through) the transistor ITR3 toward the ground voltage VSS is larger than that of current supplied from (through) the transistor ITR4 toward the ground voltage VSS. Thus, the (sinking) of the current ID (through transistor ITR3 to ground voltage VSS) slightly reduces the voltage at the fourth output node NOUT4, and so the voltage at the first output node NOUT1 becomes slightly reduced (in response to a change in the voltage of the fourth output node NOUT4).

As the voltage at the first output node NOUT1 is slightly reduced, the voltage at the second output node NOUT2, which is connected to the first output node NOUT1 via (through) the fourth control transistor CTR4, becomes slightly reduced. A reduction in the voltage at the second output node NOUT2 results in a reduction in the amount of current (IF) flowing through the second control transistor CTR2, thereby largely increasing the voltage at the drain of the second control transistor CTR2 (i.e., the voltage at the first node N1).

As the voltage at the first node N1 is increased, the third control transistor CTR3 is almost completely turned ON. In this case, the amount of first current IA, (which is maintained constant in the static state), is greatly increased, and the amount of second current IB becomes approximately zero.

When the amount of second current IB flowing through the fourth control transistor CTR4 approximates zero, the fourth control transistor CTR4 is almost entirely turned OFF. In this case, the resistance value at the first output node NOUT1 is increased. Since the amount of first current IA is also increased, the voltage at the first output node NOUT1 becomes greatly reduced.

Therefore, the pull-up transistor PUTR is turned ON and the output current IOUT is output (sourced) from the power supply voltage VDD via the third output node NOUT3. In this case, a sourcing current is generated by the amplifier 100. If a capacitor (not shown) is connected outside the amplifier (between the third output node NOUT3 and ground VSS), the capacitor will be charged by output current IOUT.

Figure 3:
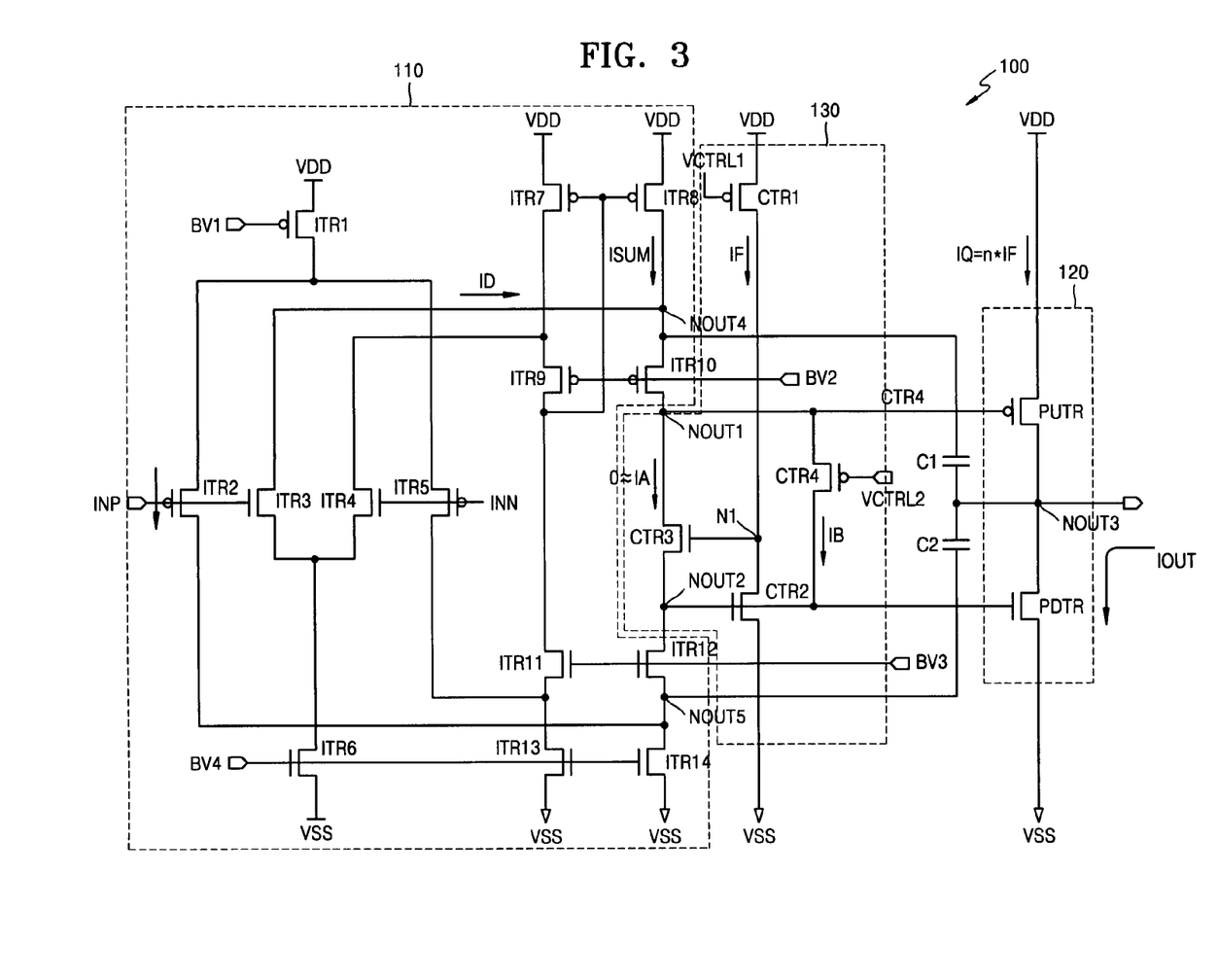
FIG. 3 is a circuit diagram illustrating the operation of the class AB amplifier of FIG. 1 in the operating state.

FIG. 3 is a circuit diagram illustrating the operation of the class AB amplifier of FIG. 1 in the amplifying state according to another embodiment of the invention. Referring to FIG. 3, when the voltage of the input signal INP is smaller than that of the input signal INN, the amount of current supplied from the transistor ITR3 toward the ground voltage VSS is smaller than that of current supplied from the transistor ITR4 toward the ground voltage VSS. As a result, the current ID flows toward the fourth output node NOUT4, and thus, the voltage at the fourth output node NOUT4 is slightly increased. In this case, the increase in the voltage at the fourth output node NOUT4 slightly increases the voltage at the first output node NOUT1.

When the voltage at the first output node NOUT1 is slightly increased, the voltage at the second output node NOUT2, which is connected to the first output node NOUT1 via the fourth control transistor CTR4, becomes slightly increased. An increase in the voltage of the second output node NOUT2 increases the amount of current flowing through the second control transistor CTR2, thereby reducing the drain voltage of the second control transistor CTR2, i.e., the voltage at the first node N1.

A reduction in the voltage at the first node N1 causes the third control transistor CTR3 to be almost entirely turned OFF. Thus, the amount of the second current IB, which is maintained constant in the static state, is largely increased and the amount of the first current IA approximates zero.

When the amount of the first current IA flowing through the third control transistor CTR3 becomes approximately zero, the third control transistor CTR3 is almost entirely turned OFF. In this case, the voltage at the second output node NOUT2 is largely increased.

Accordingly, the pull-down transistor PDTR is turned ON and the output current IOUT flows toward the ground voltage VSS. In this case, a sinking current is generated. If a capacitor (e.g., a load, not shown) is installed outside the third output node NOUT, any electric charges charged in the capacitor will be discharged.

The class AB amplifier 100 may further include capacitors C1 and C2 between the fourth and fifth output nodes NOUT4 and NOUT5. The capacitors C1 and C2 control the AC characteristics of the Class AB amplifier 100.

As described above, since the amounts of quiescent current IQ and output current IOUT can be controlled according to the current mirror method, the Class AB amplifier 100 can be easily designed as an amplifier designer desires.

Figure 4:
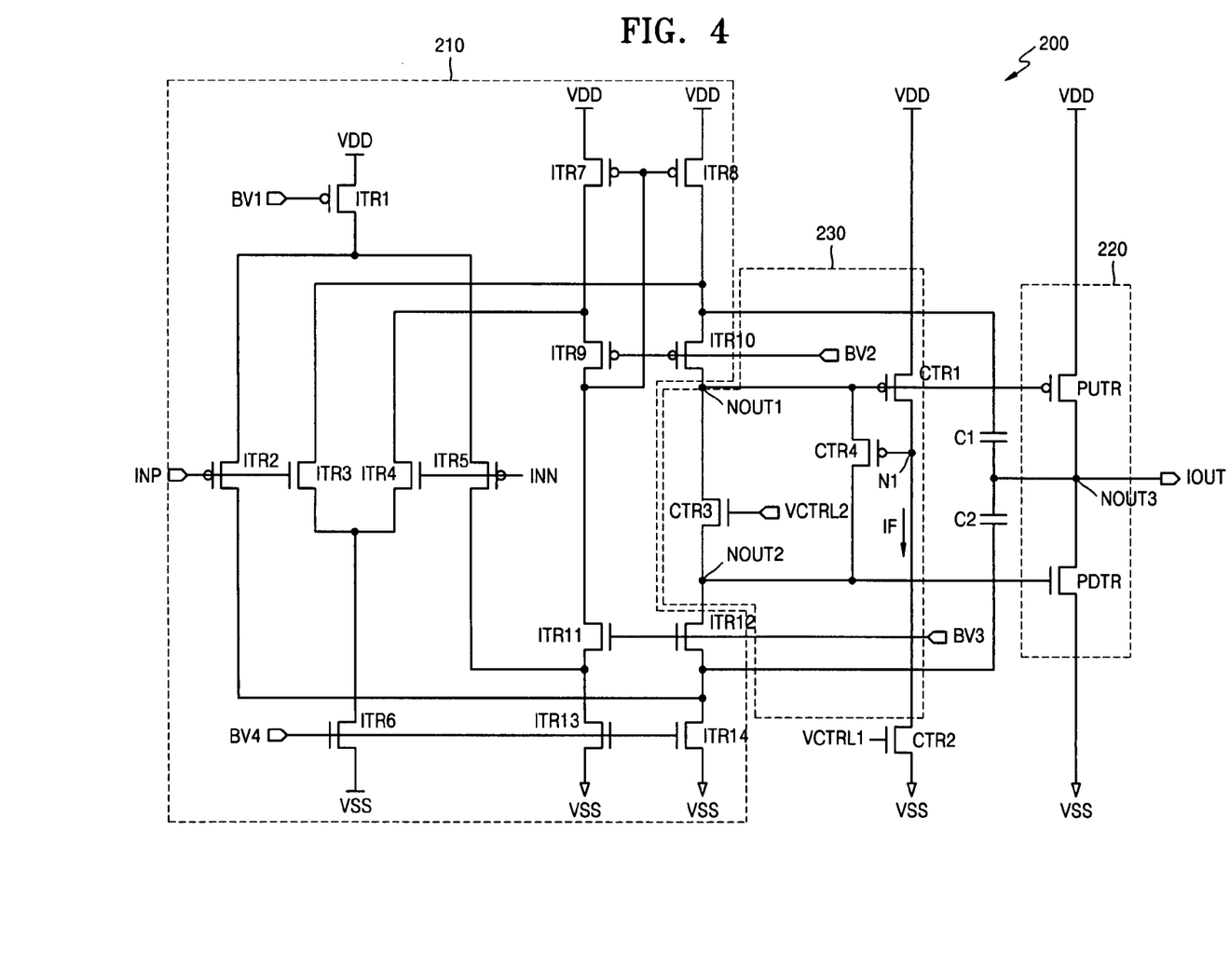
FIG. 4 is circuit diagram of a class AB amplifier according to another embodiment of the invention.

FIG. 4 is a circuit diagram of a class AB amplifier according to another embodiment of the invention. In the class AB amplifier 200 of FIG. 4, the structure of a control circuit 230 is different from that of the control circuit 130 of the Class AB amplifier 100 of FIG. 1, but the structures of an input circuit 210 and an output circuit 220 are similar as those of the input circuit 100 and the output circuit 120 of the Class AB amplifier 100 of FIG. 1.

The control circuit 230 of FIG. 4 includes first through fourth control transistors CTR1 through CTR4. A power supply voltage VDD is applied to a first end of the first control transistor CTR1, and a gate and a second end thereof are connected to a first output node NOUT1 and a first node N1, respectively. A first end of the second control transistor CTR2 is connected to the first node N1, a first control voltage VCTRL1 is applied to its gate, and a ground voltage VSS is applied to its second end.

A first end and a second end of the third control transistor CTR3 are connected to the first output node NOUT1 and a second output node NOUT2, respectively, and a second control voltage VCTRL2 is applied to its gate. A first end, a second end, and a gate of the fourth control transistor CTR4 are connected to the first and second output nodes NOUT1 and NOUT2 and the first node N1, respectively.

Referring to FIG. 4, a first bias current IF flows from the first control transistor CTR1 to the second control transistor CTR2. In this embodiment, the third control transistor CTR3 is an NFET (e.g., NMOS) transistor and the fourth control transistor CTR4 is a PFET (e.g., PMOS) transistor.

Unlike the control circuit 130 of FIG. 1, in the control circuit 230, the second control voltage VCTRL2 is applied to the third control transistor CTR3, and the fourth control transistor CTR4 is controlled by the first bias current IF generated using the first control voltage VCTRL1.

In the control circuit 230, the structure in which the first and second control voltages VCTRL1 and VCTRL2 are connected to each other, is complementary to that in the control circuit 130 of FIG. 1, but the operating principles of the Class AB amplifier 200 are similar to those of the Class AB amplifier 100 of FIG. 1. Therefore, a detailed description of the operations of the Class AB amplifier 200 will be omitted for the convenience of persons skilled in the art.

As described above, a class AB amplifier according to embodiments of the invention controls amounts of the amplifier's quiescent current and output current, and allows for easy adjustment and control thereof. This amplifier can also be easily designed and fabricated.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An amplifier comprising:
an input circuit configured to transform a difference in voltages between input signals into a current;

an output circuit configured to output an output current to a load outside of the amplifier; and
a control circuit, to which a first control voltage and a second control voltage are applied from the outside of the amplifier, and which control the amount of quiescent current flowing through the output circuit in a first operating mode,
wherein the control circuit together with the output circuit form a current mirror and the control circuit controls the amount of the quiescent current to be proportional to the amount of a first bias current.

2. The amplifier of claim 1, wherein the input circuit is a Folded Cascode operational transconductance amplifier (OTA).

3. The amplifier of claim 1, wherein, in die first operating mode, the control circuit controls the amount of the quiescent current to be proportional to the amount of a first bias current according to current mirror method.

4. The amplifier of claim 1, wherein the amplifier is a class AB amplifier, and the first operating mode is a mode where voltages of the input signals are equal to each other and the quiescent current flows through the output circuit.

5. The amplifier of claim 1, wherein the control circuit also controls the amount of the output current output in response to a difference in voltages between input signals, in a second operating mode;
wherein the second operating mode is a mode where the voltages of the input signals are different from each other and the output current is sourced from or sinked into the output circuit.

6. The amplifier of claim 1, wherein the first and second control voltages are DC voltages supplied from the outside of the amplifier; and
the amount of the first bias current is determined by the first control voltage.

7. The amplifier of claim 1, wherein the output circuit comprises:
a pull-up transistor having a first end to which a power supply voltage is applied, a gate connected to a first output node of the input circuit, and a second end connected to a third output node of the output circuit; and
a pull-down transistor having a first end connected to the third output node of the output circuit, a gate connected to a second output node of the input circuit, and a second end to which a ground voltage is applied.

8. The amplifier of claim 7, wherein the control circuit comprises:
a first control transistor having a first end to which the power supply voltage is applied, a gate to which the first control voltage is applied, and a second end connected to a first node;
a second control transistor having a first end connected to the first node, a gate connected to the second output node, and a second end to which the ground voltage is applied;
a third control transistor having a first end and a second end connected to the first and second output nodes, respectively, and a gate connected to the first node; and
a fourth control transistor having a first end and a second end connected to the first and second output nodes, respectively, and a gate to which the second control voltage is applied,
wherein the first bias current flows though the fast control transistor and through the second control transistor.

9. The amplifier of claim 8, wherein the third control transistor is an NMOS transistor and the fourth control transistor is a PMOS transistor.

10. The amplifier of claim 7, wherein the control circuit comprises:
a first control transistor having a first end to which the power supply voltage is applied, a gate connected to the first output node, and a second end connected to the first node;
a second control ransistor having a first end connected to the first node, a gate to which the first control voltage is applied, and a second end to which the ground voltage is applied;
a third control transistor having a first end and a second end connected to the first and second output nodes, respectively, and a gate to which the second control voltage is applied; and
a fourth control transistor having a first end, a second end, and a gate connected to the first and second output nodes and the first node, respectively,
wherein the first bias current flows through the first control transistor and through the second control transistor.

11. The amplifier of claim 10, wherein the third control transistor is an NMOS transistor and the fourth control transistor is a PMOS transistor.

12. An amplifier comprising:
a Folded Cascode operational transconductance amplifier (OTA) controlling voltages at a first output node and a second output node by transforming a voltage difference between input signals into a current;
an output circuit for outputting an output current to the outside of the Class AB amplifier in response to a difference in the voltages at the first and second output nodes; and
a control circuit to which a first control voltage and a second control voltage are applied from the outside of the amplifier for adjusting the amount of quiescent current flowing through the output circuit, using a first bias current generated in response to the first control voltage, in a first operating mode,
wherein the control circuit together with the output circuit form a current mirror and the control circuit controlsthe amount of the quiescent current to be proportional to the amount of the first lines current.

13. The amplifier of claim 12, wherein the first operating mode is a mode where voltages of die input signals are equal to each other and the quiescent current flows through the output circuit.

14. The amplifier of claim 12, wherein the second operating mode is a mode where the voltages of the input signals are different from each other and the output current is sourced from or sinked into the output circuit.

15. The amplifier of claim 12, wherein the first control voltage is a DC voltage.

16. The amplifier of claim 12, wherein the output circuit comprises:
a pull-up transistor having a first end to which a power supply voltage is applied, a gate connected to the first output node, and a second end connected to a third output node; and
a pull-down transistor having a first end connected to the third output node, a gate connected to the second output node, and a second end to which a ground voltage is applied.

17. The amplifier of claim 16, wherein the control circuit comprises:

a first control transistor having a first end to which the power supply voltage is applied, a gate to which the first control voltage is applied, and a second end connected to the first node;

a second control transistor having a first end connected to the first node, a gate connected to the second output node, and a second end to which the ground voltage is applied;

the first current path including a third control transistor which has a first end and a second end connected to the first and second output nodes, respectively, and controls the amount of current flowing along the first current path in response to the voltage at the first node; and the second current path including a fourth control transistor which has a first end and a second end connected to the first and second output nodes, respectively, and controls the amount of current flowing along the second current path in response to a second control voltage, wherein the first bias current flows through the first control transistor through the second control transistor.

18. The amplifier of claim 17, wherein the third control transistor is an NMOS trausistor and the fourth control transistor is a PMOS transistor.

19. The amplifier of claim 16, wherein the control circuit comprises:

a first control transistor having a first end to which the power supply voltage is applied, a gate connected to the first output node, and a second end connected to a first node;

a second control transistor having a first end connected to the first node, a gate to which the first control voltage is applied, and a second end to which the ground voltage is applied;

the first current path formed between the first and second output nodes, and including a third control transistor which has a first end and a second end connected to the first and second output nodes, respectively and controls the amount of current flowing along the first current path in response to a second control voltage; and the second current path formed between the first and second output nodes, and including a fourth control transistor which has a first end and a second end connected to the first and second output nodes, respectively and controls the amount of current flowing along the second current path in response to a voltage at the firsf node, wherein the first bias current flows through the first control transistor and through the second control transistor.

20. The amplifier of claim 19, wherein the third control transistor is an NMOS transistor and the fourth control transistor is a PMOS transistor.

21. An analog amplifier comprising:

an operational transconductance amplifier (OTA) controlling voltages at a first output node and a second output node by transforming a voltage difference between input signals into a first current;

a current mirror including an output circuit of the analog amplifier; and a control circuit, to which a first control voltage and a second control voltage are applied from the outside of the amplifier and which control the amount of quiescent current flowing through the output circuit in a first operating mode, wherein the control circuit together with the output circuit form the current mirror and the control circuit controls the amount of the quiescent current to be proportional to the amount of a first bias current.

22. The analog amplifier of claim 21, wherein the output circuit outputs an output current, to a load connected to the analog amplifier.

23. The analog amplifier of claim 22, wherein output current is proportional to the difference between the voltages at the first and second output nodes.

24. The analog amplifier of claim 22, wherein output current, is proportional to the difference between input signals.

* * * * *